(12) United States Patent
Kajiyama et al.

(10) Patent No.: US 11,217,644 B2
(45) Date of Patent: Jan. 4, 2022

(54) SEMICONDUCTOR DEVICE, TRANSISTOR ARRAY SUBSTRATE AND LIGHT EMITTING DEVICE

(71) Applicant: Japan Display Inc., Tokyo (JP)

(72) Inventors: Kenta Kajiyama, Tokyo (JP); Masakazu Kaida, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/665,276

(22) Filed: Oct. 28, 2019

(65) Prior Publication Data

US 2020/0058720 A1 Feb. 20, 2020

Related U.S. Application Data

(63) Continuation of application No. 15/814,492, filed on Nov. 16, 2017, now Pat. No. 10,497,766, which is a
(Continued)

(30) Foreign Application Priority Data

Apr. 22, 2015 (JP) .................................. 2015-087356

(51) Int. Cl.
*H01L 27/32* (2006.01)
(52) U.S. Cl.
CPC ...... *H01L 27/3248* (2013.01); *H01L 27/3258* (2013.01); *H01L 2227/323* (2013.01)
(58) Field of Classification Search
CPC .................. H01L 27/3248; H01L 27/3258
See application file for complete search history.

(56) References Cited

U.S. PATENT DOCUMENTS 6,313,481 B1 11/2001 Ohtani et al.
9,229,283 B2 1/2016 Yeo et al.
(Continued)

FOREIGN PATENT DOCUMENTS

CN 104241296 A 12/2014
JP 2001-056485 A 2/2001
(Continued)

OTHER PUBLICATIONS

Korean Office Action dated Jun. 5, 2017 for the corresponding Korean Application No. 10-2016-0037304, with partial translation.
(Continued)

*Primary Examiner* — Michele Fan
(74) *Attorney, Agent, or Firm* — Michael Best & Friedrich LLP

(57) ABSTRACT

A display device and manufacturing method thereof with a high level of reliability is provided without increasing the number of manufacturing processes. The display device includes a first conductor, a first insulation layer including a first contact hole exposing a part of the first conductor, a second insulation layer including a second contact hole exposing at least a part of the first contact hole and a part of a surface of the first insulation layer, a pixel electrode overlapping a part of the second contact hole and electrically connected to the first conductor, and a third insulation layer contacting the first insulation layer via the second contact hole.

13 Claims, 15 Drawing Sheets

Related U.S. Application Data continuation of application No. 15/072,631, filed on Mar. 17, 2016, now Pat. No. 9,853,094.

(56) References Cited

U.S. PATENT DOCUMENTS

| | | | |
|---|---|---|---|
| 9,472,582 B2* | 10/2016 | Kim | G02F 1/134363 |
| 9,853,094 B2 | 12/2017 | Kajiyama et al. | |
| 2002/0013019 A1 | 1/2002 | Ohtani et al. | |
| 2002/0043660 A1 | 4/2002 | Yamazaki et al. | |
| 2005/0012454 A1 | 1/2005 | Yamazaki et al. | |
| 2005/0116240 A1* | 6/2005 | Kim | H01L 27/3244 |
| | | | 257/88 |
| 2007/0058099 A1 | 3/2007 | Eguchi | |
| 2009/0310053 A1* | 12/2009 | Kanaya | G02F 1/134363 |
| | | | 349/46 |
| 2010/0271582 A1* | 10/2010 | Yamakawa | G02F 1/136227 |
| | | | 349/138 |
| 2011/0003418 A1 | 1/2011 | Sakata et al. | |
| 2011/0050551 A1* | 3/2011 | Ota | G09G 3/3225 |
| | | | 345/87 |
| 2012/0319119 A1* | 12/2012 | Kim | G02F 1/136209 |
| | | | 257/59 |
| 2013/0010246 A1 | 1/2013 | Miwa et al. | |
| 2013/0320306 A1 | 12/2013 | Choi et al. | |
| 2014/0111404 A1 | 4/2014 | Omata et al. | |
| 2014/0197417 A1 | 7/2014 | Nanai et al. | |
| 2014/0375921 A1 | 12/2014 | Moriya et al. | |
| 2015/0060832 A1* | 3/2015 | Ito | H01L 51/5225 |
| | | | 257/40 |
| 2015/0076501 A1* | 3/2015 | Hayashi | H01L 27/124 |
| | | | 257/72 |
| 2015/0123113 A1* | 5/2015 | Park | H01L 27/1244 |
| | | | 257/43 |
| 2015/0168759 A1 | 6/2015 | Amano | |
| 2015/0212375 A1* | 7/2015 | Park | G02F 1/133345 |
| | | | 349/46 |
| 2015/0221732 A1 | 8/2015 | Kanda | |
| 2015/0346534 A1* | 12/2015 | Lee | G02F 1/13394 |
| | | | 349/43 |
| 2015/0355516 A1* | 12/2015 | Imai | G02F 1/1337 |
| | | | 349/123 |
| 2016/0247835 A1 | 8/2016 | Jiang et al. | |
| 2016/0349583 A1 | 12/2016 | Park et al. | |
| 2016/0358943 A1 | 12/2016 | Okada et al. | |
| 2017/0062489 A1* | 3/2017 | Chen | H01L 27/124 |
| 2017/0062490 A1 | 3/2017 | Noh | |
| 2017/0098413 A1 | 4/2017 | Lee et al. | |
| 2017/0235173 A1 | 8/2017 | Katoh et al. | |
| 2018/0247991 A1 | 8/2018 | Oh et al. | |

FOREIGN PATENT DOCUMENTS

| | | |
|---|---|---|
| JP | 2014-142641 A | 8/2014 |
| JP | 2015-015475 A | 1/2015 |
| JP | 2016-024887 A | 2/2016 |
| KR | 10-2000-0017071 A | 3/2000 |
| KR | 10-2014-0050559 A | 4/2014 |
| WO | 2011/129128 A1 | 10/2011 |

OTHER PUBLICATIONS

Chinese Office Action dated Jun. 5, 2018 for the corresponding Chinese Patent Application No. 201610162034.X, with partial translation.

Japanese Office Action dated Sep. 11, 2018 for the corresponding Japanese Patent Application No. 2015-087356, with partial translation.

* cited by examiner

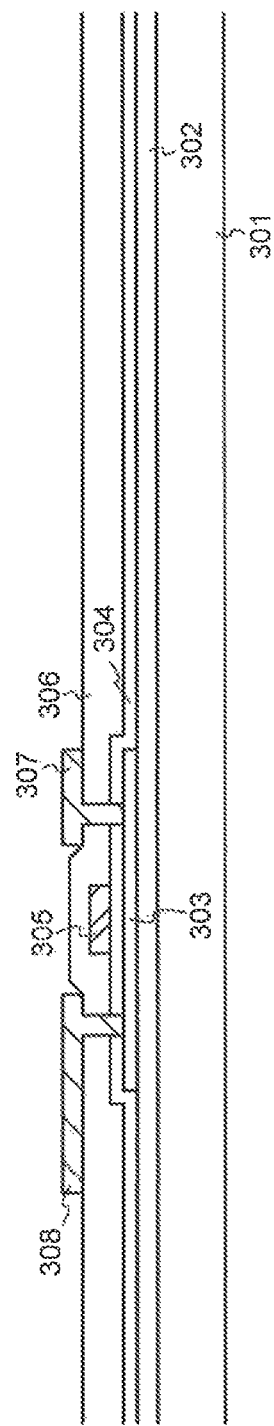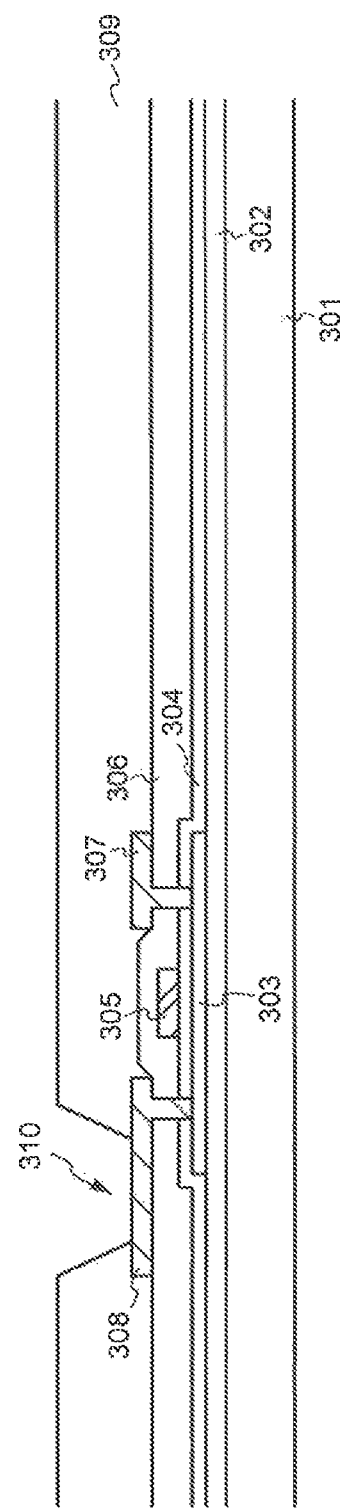

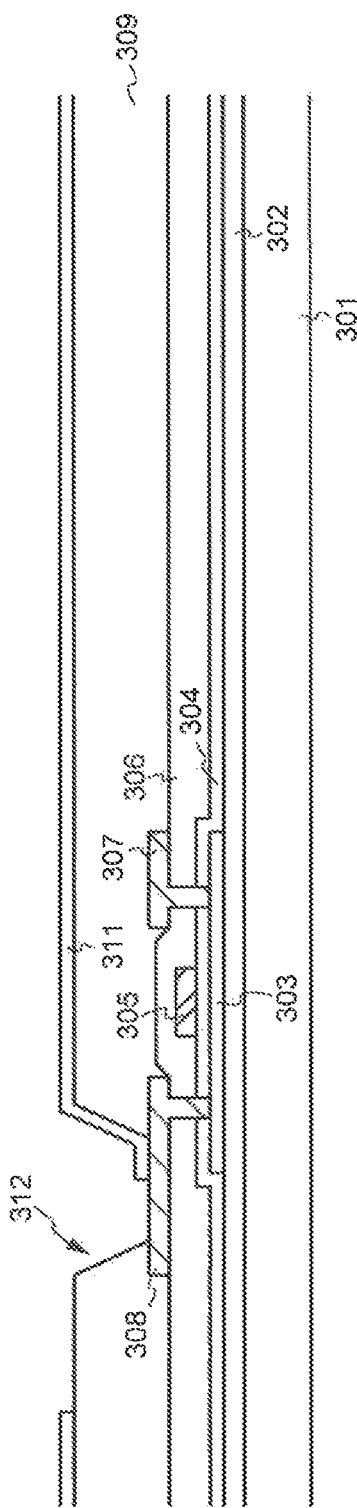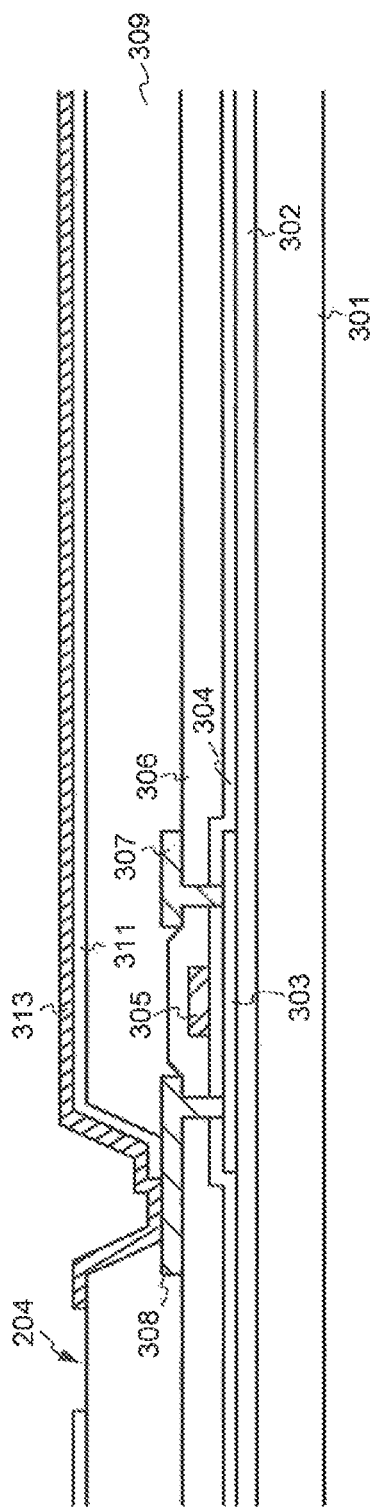

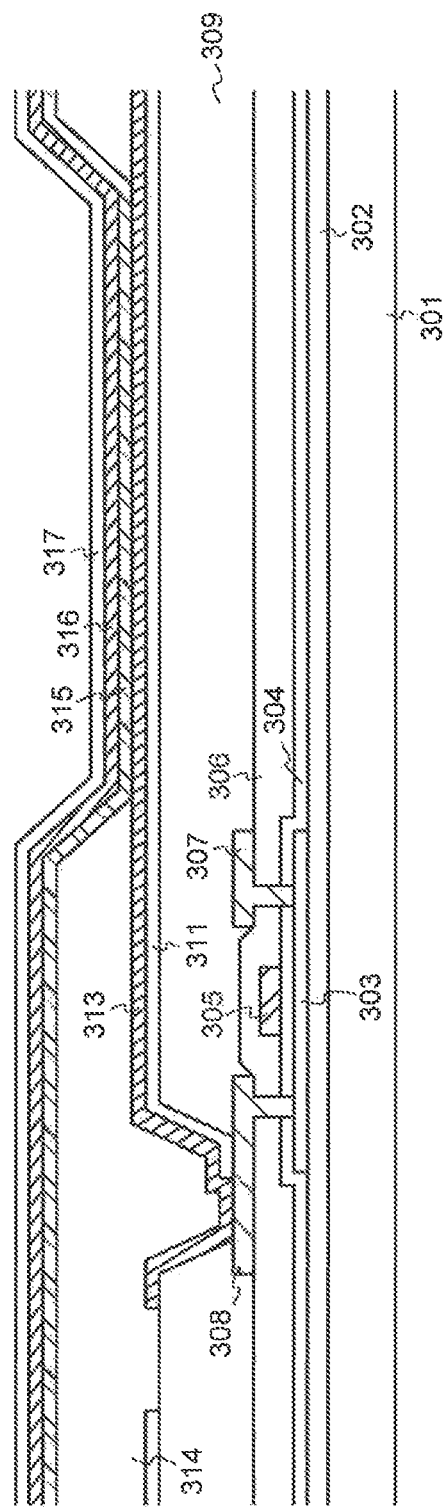

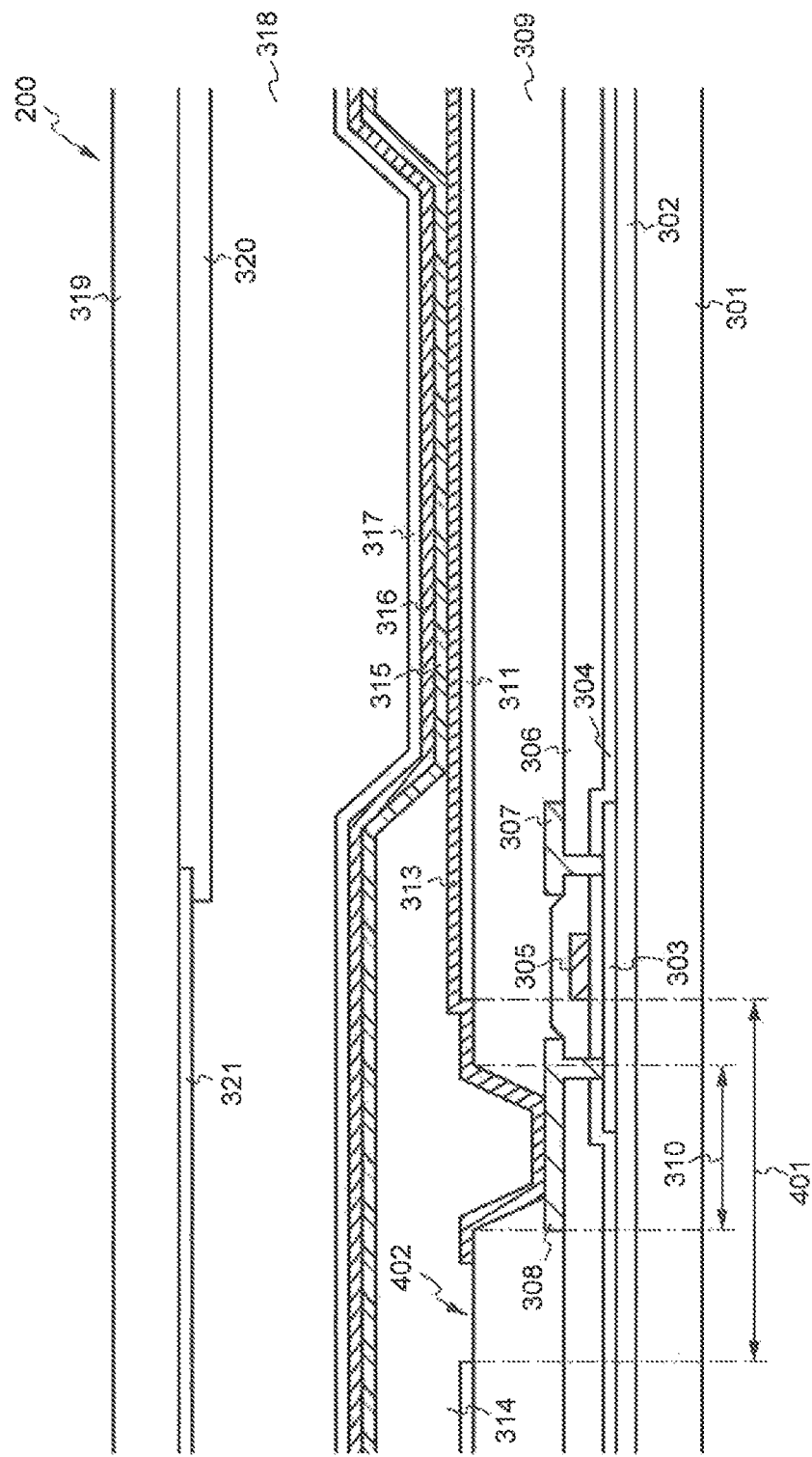

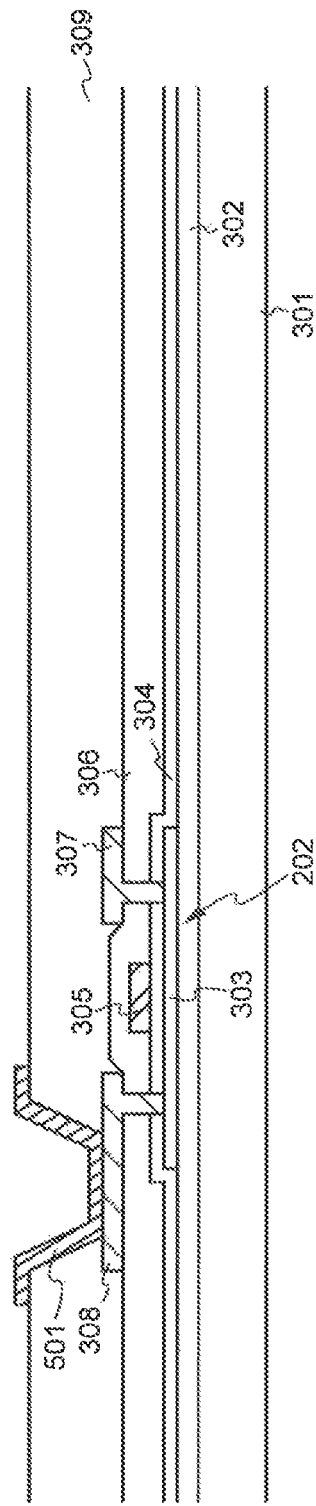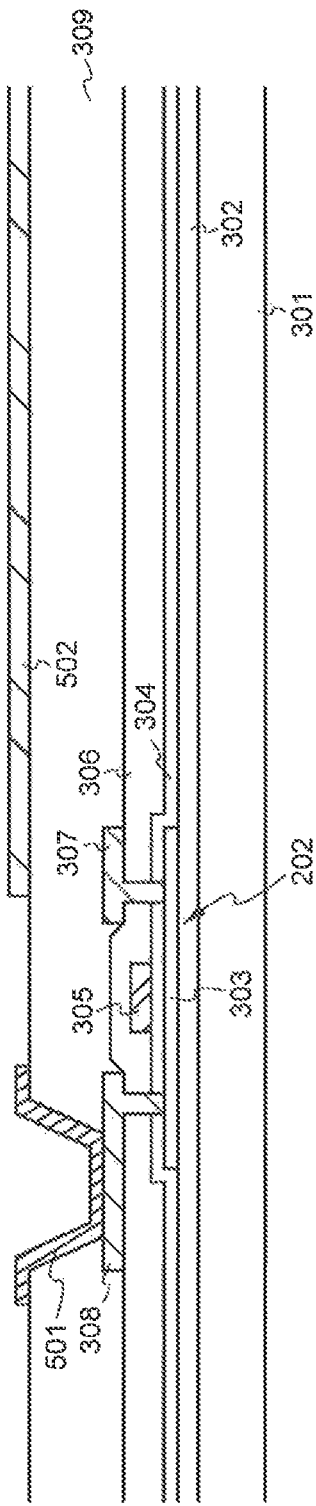

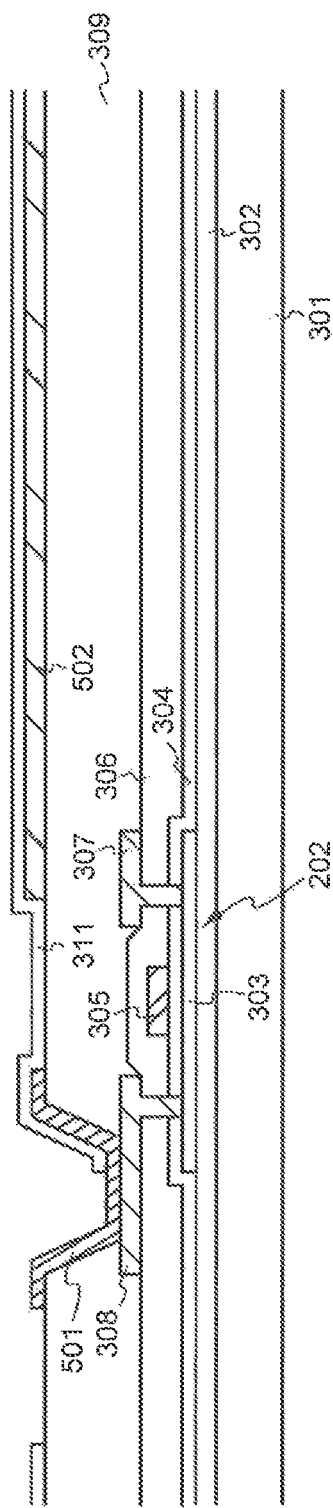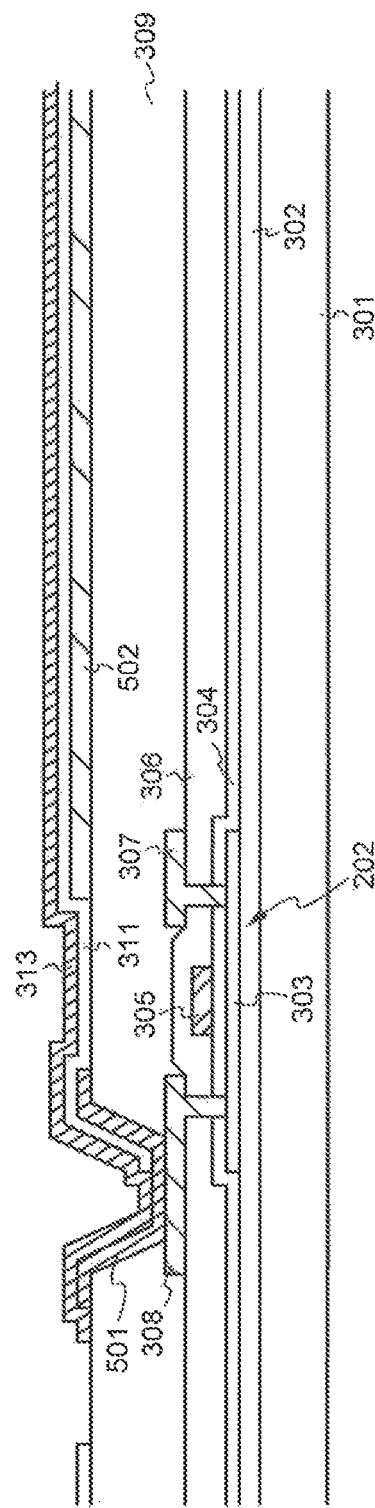

SEMICONDUCTOR DEVICE, TRANSISTOR ARRAY SUBSTRATE AND LIGHT EMITTING DEVICE

CROSS REFERENCE TO RELATED APPLICATIONS

This application is a continuation of U.S. patent application Ser. No. 15/814,492, filed on Nov. 16, 2017, which, in turn, is a continuation of U.S. patent application Ser. No. 15/072,631 (now U.S. Pat. No. 9,853,094) filed on Mar. 17, 2016. Further, this application is based upon and claims the benefit of priority from the prior Japanese Patent Application No. 2015-087356, filed on Apr. 22, 2015, the entire contents of which are incorporated herein by reference.

FIELD

The present invention is related to a display device including a plurality of pixels. In particular, the present invention is related to a display device arranged with a light emitting element including an organic light emitting layer in each pixel.

BACKGROUND

Conventionally, a display device is known including a plurality of pixels formed above a substrate. A LCD (Liquid Crystal Display) and OLED (Organic Light Emitting Diode) display are typical examples of such a display device. In particular, in recent years, the development of OLED displays having excellent response characteristics and viewing angle characteristics is progressing rapidly.

An OLED display is a display device with a light emitting element using an electroluminescence phenomenon arranged in each pixel. A display device using an organic light emitting layer as a light emitting element is called an organic EL (Electro Luminescence) display device. This type of display device can emit light in at colors of various wavelengths by selecting the light emitting material which forms the light emitting layer.

Generally, each pixel formed above a substrate includes a light emitting element and a drive transistor which supplies a current for driving the light emitting element. After a drive transistor is formed above the substrate, the drive transistor is covered by an insulation layer formed from an organic resin material and a light emitting element is formed above the insulation layer. The insulation layer is used as a planarized film for relieving undulations caused by the transistor. For example, a display device having the structure described in Japanese Laid Open Patent No. 2014-142641 is typically known.

SUMMARY

A display device in one embodiment of the present invention includes a first conductor, a first insulation layer including a first contact hole exposing a part of the first conductor, a second insulation layer including a second contact hole exposing at least a part of the first contact hole and a part of a surface of the first insulation layer, a pixel electrode overlapping a part of the second contact hole and electrically connected to the first conductor, and a third insulation layer contacting the first insulation layer via the second contact hole. The pixel electrode may also be electrically connected to the first conductor via a second conductor contacting the first conductor.

A method of manufacturing a display device in one embodiment of the present invention includes forming a first conductor, forming a first insulation layer arranged with a first contact hole so as to expose a part of the first conductor, forming a second insulation layer arranged with a second contact hole so as to expose at least a part of the first contact hole and a part of a surface of the first insulation layer, forming a pixel electrode overlapping a part of the second contact hole and electrically connected to the first conductor, and forming a third insulation layer contacting the first insulation layer via the second contact hole. Furthermore, a second conductor may be formed electrically connected to the first conductor so as to cover the entire first contact hole after forming the first contact hole, and the pixel electrode may be electrically connected to the first conductor via the second conductor.

BRIEF EXPLANATION OF THE DRAWINGS

FIG. 6A is a diagram showing a manufacturing process of an array substrate of an organic EL display device of a first embodiment;

FIG. 6B is a diagram showing a manufacturing process of an array substrate of an organic EL display device of a first embodiment;

FIG. 7A is a diagram showing a manufacturing process of an array substrate of an organic EL display device of a first embodiment;

FIG. 7B is a diagram showing a manufacturing process of an array substrate of an organic EL display device of a first embodiment;

FIG. 8 is a diagram showing a manufacturing process of an array substrate of an organic EL display device of a first embodiment;

FIG. 9 is a diagram showing a structure of a pixel of an organic EL display device of a second embodiment;

FIG. 12A is a diagram showing a manufacturing process of an array substrate of an organic EL display device of a third embodiment;

FIG. 12B is a diagram showing a manufacturing process of an array substrate of an organic EL display device of a third embodiment;

FIG. 13A is a diagram showing a manufacturing process of an array substrate of an organic EL display device of a third embodiment; and FIG. 13B is a diagram showing a manufacturing process of an array substrate of an organic EL display device of a third embodiment.

DESCRIPTION OF EMBODIMENTS

For example, the display device described in FIG. 22 of patent document 1 is arranged with a resin layer 7017 as a planarized film above a drive transistor 7001. A contact hole which reaches an electrode forming a part of the drive transistor 7001 is arranged in the resin layer 7017. In addition, a second protection insulation layer 7018 formed from silicon nitride is arranged so as to cover the entire resin layer 7017 including the contact hole. In other words, the resin layer 7017 is in a sealed state due to the second protection insulation layer 7018.

From the experience of the present inventors, it is known that in a manufacturing process after forming a resin layer as a planarized film, gas including water from the resin layer is sometimes produced due to heating and the like. As a result, in the case were the structure described in the patent document 1 is adopted, there is nowhere for gas produced from a resin layer to escape, water accumulates the boundary between the resin layer and a protection layer above and there is a danger that protection layer may peel away. This type of problem leads to the effect of reducing the reliability of the display device.

One aim of the invention is to provide a display device with a level of reliability and a manufacturing method thereof without increasing the number of manufacturing processes.

Each embodiment of the present invention is explained below while referring to the diagrams. However, the present invention can be realized by various different forms without departing from the scope of the present invention and should not be interpreted as being limited to the contents described in the embodiments exemplified below.

In addition, although the width, thickness and shape of each component are represented schematically compared to actual component in order to better clarify the explanation of the invention, these are merely examples and should not limit an interpretation of the present invention. In addition, in the present specification and each diagram, the same reference symbols are attached to the same elements which have been previously been described and therefore a detailed explanation of such elements may be omitted.

First Embodiment

<Structure of a Display Device>

Figure 1:
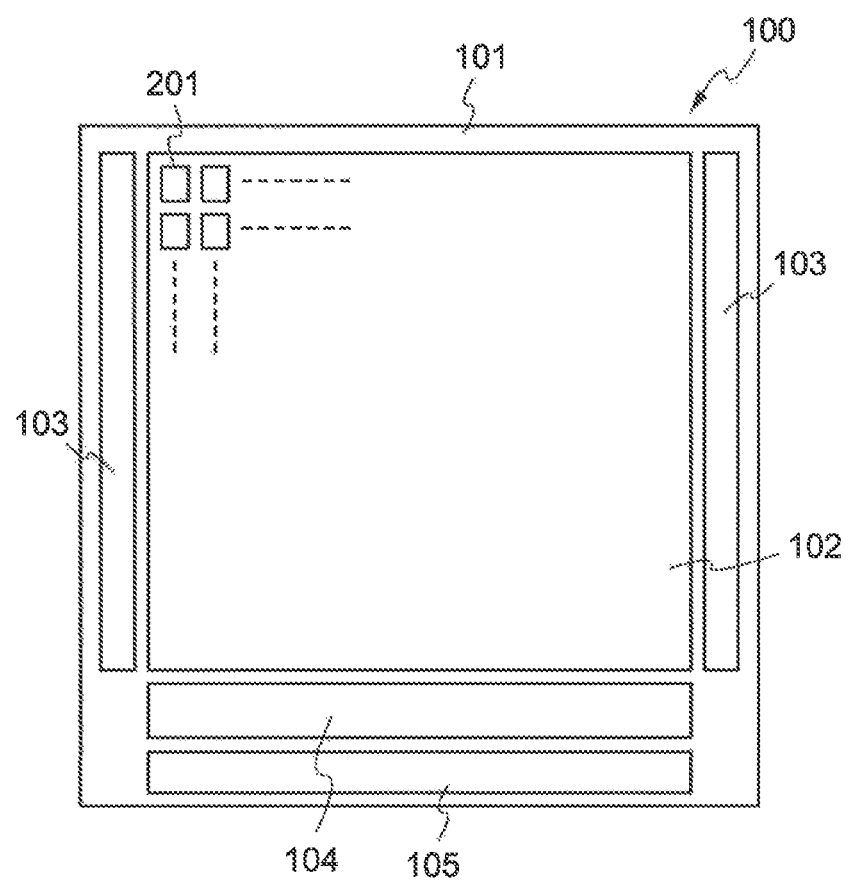
FIG. 1 is a diagram showing a structure of an organic EL display device of a first embodiment.

FIG. 1 is a diagram showing a structure of an organic EL display device 100 in a first embodiment. Specifically, FIG. 1 shows an approximate structure in the case where the EL display device 100 is seen in a planar view. Furthermore, the appearance of an EL display device seen from a perpendicular direction to the screen (display region) is referred to as [planar view] in the present specification. As is shown in FIG. 1, the EL display device 100 is arranged with a pixel part (display region) 102, a scanning line drive circuit 103, a data line drive circuit 104 and a driver IC 105 formed above a substrate 101. The driver circuit 105 functions as a control part for providing signals to the scanning line drive circuit 103 and date line drive circuit 104.

Furthermore, the data line drive circuit 104 may sometimes be included in the driver IC 105. Although an example in which the driver IC 105 is integrally formed above the substrate 101 is shown in FIG. 1, the driver IC 105 may also be arranged above a separate substrate 101 in a form such as a IC chip. In addition, an externally attached form may also be adopted in which the driver IC 105 is arranged on a FPC (Flexible Printed Circuits).

A plurality of pixels 201 are arranged in matrix shape in a row direction and column direction in the pixel part 102 shown in FIG. 102. A data signal is provided from the data line drive circuit 104 according to image data in each pixel 201. A transistor arranged within each pixel 201 is driven according to these data signals and it screen display is possible according to the image data. Typically, it is possible to use a thin film transistor as the transistor. However, an element may be used as long as it is arranged with a current control function. In addition, a thin film transistor may be an N channel type or P channel type transistor. In the present embodiment, the thin film transistor used in the display part 102 is an N channel type.

Figure 2:
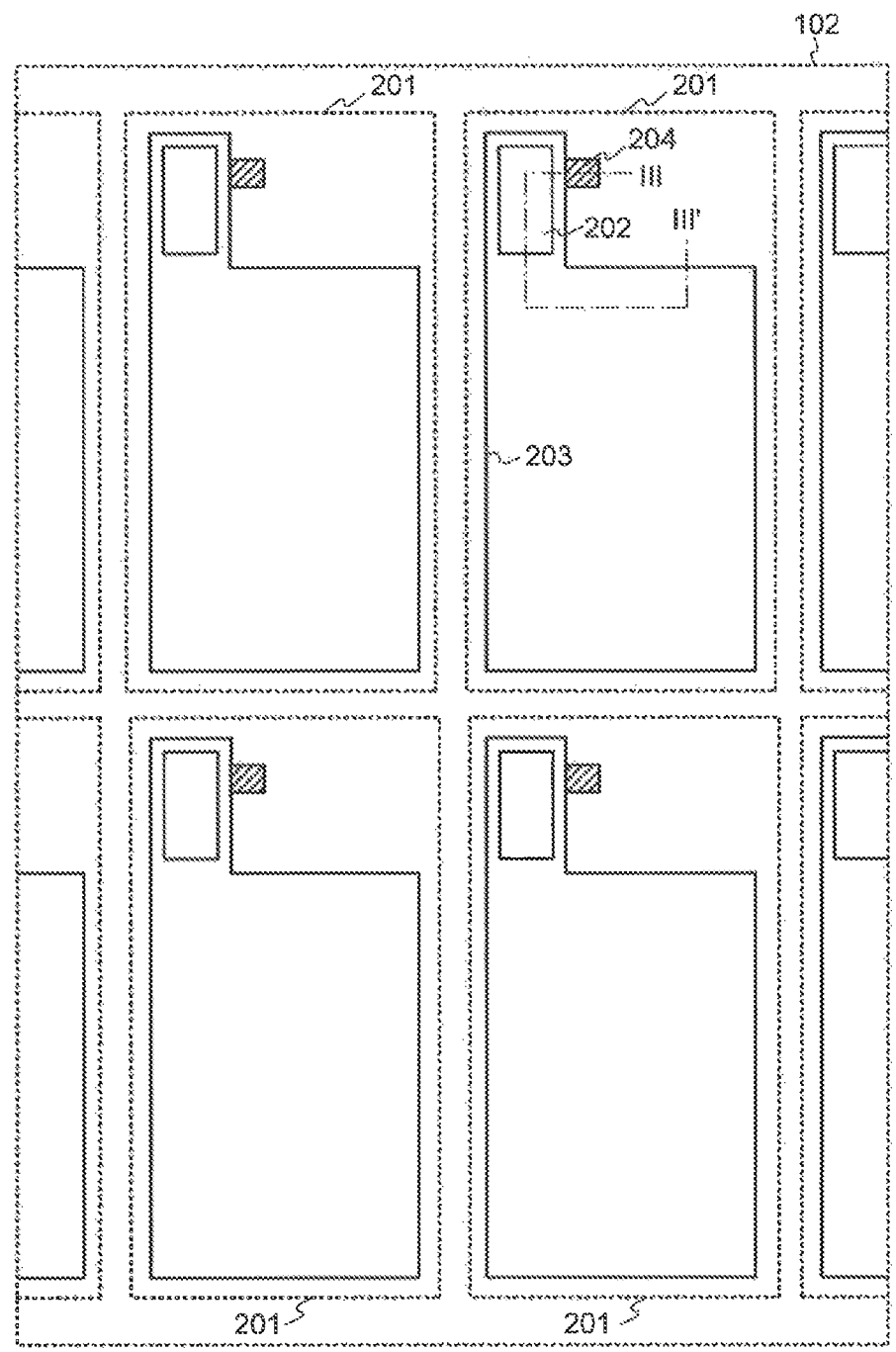
FIG. 2 is a diagram showing a structure of a pixel part of an organic EL display device of a first embodiment.

FIG. 2 is a diagram showing a structure of the pixel part 102 in the organic EL display device 100 of the first embodiment. Specifically, a part of the pixel part 102 is shown having a structure of four pixels 201 seen in a planar view. Furthermore, although four pixels are exemplified in FIG. 2, actually millions of pixels 201 are arranged in a matrix shape. In addition, the structure within the pixel 201 is not limited to the structure shown in FIG. 2.

The interior of the pixel 201 includes a thin film transistor 202. As is described herein, the thin film transistor 202 functions as a current control element for supplying an appropriate current to a light emitting element. That is, a pixel electrode 202 is electrically connected to a source electrode or drain electrode of the thin film transistor 202 and a current is supplied to a light emitting element in which the pixel electrode 203 is the anode. Furthermore, although an explanation is omitted here, a thin film transistor which functions as a switching element may be arranged within the pixel 201 and a pixel may be formed using a plurality of transistors.

The organic EL display device 100 of the present embodiment is arranged with an aperture part 204 for removing water adjacent to the pixel electrode 203. The aperture part 204 is arranged in an inorganic insulation layer which covers a resin layer for emitting gas which includes water produced from the resin layer which functions as a planarized film to the exterior. A specifically structure is described herein.

Furthermore, although it is exemplified of the pixels 201 arranged in stripes as one example of the arrangement of the pixels 201 in the present embodiment, an arrangement which realizes a delta arrangement, Bayer arrangement or pentile structure are also possible.

Figure 3:
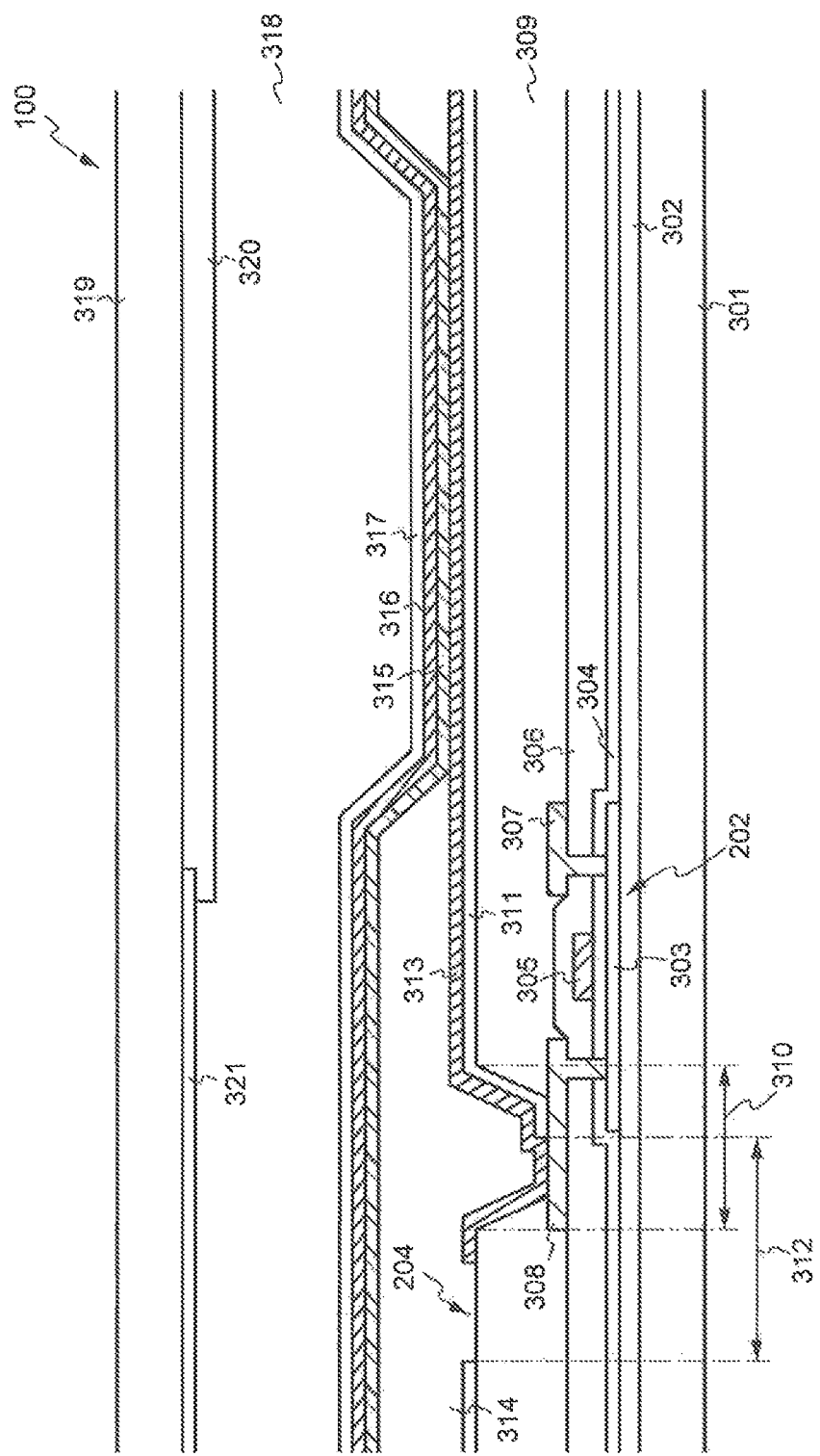
FIG. 3 is a diagram showing a structure of pixel of an organic EL display device of a first embodiment.

FIG. 3 is a diagram showing the structure of a pixel 201 in the organic EL display device 100 of the first embodiment. Specifically, FIG. 3 shows a cross-section structure where the pixel 201 shown in FIG. 2 is cut along the line III-III'. In FIG. 3, an insulation layer formed from an inorganic material such as silicon oxide, silicon nitride or aluminum oxide is arranged as a ground layer 302 above a first substrate 301 and above this the thin film transistor 202 is formed. For example, it is possible to adopt a stacked structure of a silicon oxide layer and silicon nitride layer as the ground layer 302. This structure may be appropriately determined after considering adhesion with the first substrate 301 or gas barrier properties with respect to the thin film transistor 202.

It is possible to use a glass substrate, silica substrate or flexible substrate (polyimide, polyethylene terephthalate, polyethylene naphthalate or a substrate which can be bent) as the first substrate 301. In the case where the first substrate 301 does not require light blocking properties, it is possible to use a metal substrate, ceramic substrate or semiconductor substrate. In particular, in the case where a flexible substrate is used as the substrate, it is preferred that a ground layer including the stacked structure described above is arranged in order to increase the protection function from the exterior.

The thin film transistor 202 may be formed using any method. The structure of the thin film transistor 202 may be a top gate type or bottom gate type. In the present embodiment, the thin film transistor 202 includes a semiconductor layer 303 arranged above the ground layer 302, a gate insulation film 304 covering the semiconductor layer 304, a gate electrode 305 arranged above the gate insulation film 304, an interlayer insulation film 306 covering the gate electrode 305, and a source electrode 307 and drain electrode 307 arranged above the interlayer insulation film 306 and each connected to the semiconductor layer 303 respectively.

Furthermore, there is no particular limitation to the material of each layer forming the thin film transistor 202. Typically it is possible to use polysilicon or amorphous silicon as the semiconductor layer 303 for example. It is possible to use silicon oxide as the gate insulation film 304. It is possible to use silicon oxide or silicon nitride as the interlayer insulation film 306 and these layers can be stacked.

A first insulation layer 309 which functions as a planarized film is arranged above the thin film transistor 202 formed as described above. In the present embodiment, a thin film formed by a resin material is used as the first insulation layer 309. For example, it is possible to use an organic resin material such as polyimide, polyamide, acryl or epoxy. These materials can be used to form a film using a solution coating method and have characteristics such as high planarization effects.

Figure 4:
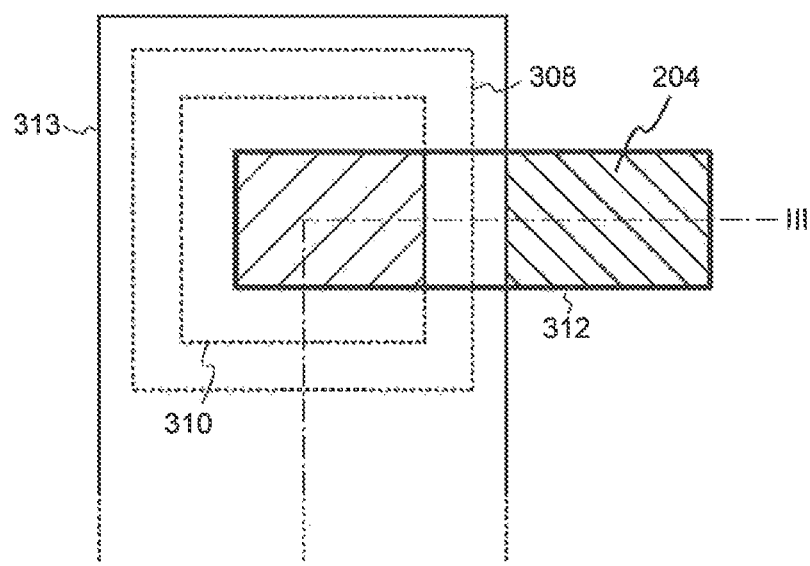
FIG. 4 is a diagram showing a structure of one part of a pixel of an organic EL display device of a first embodiment.

The first insulation layer 309 includes a first contact hole 310 which exposes a part of the source electrode or drain electrode 308 (that is, overlaps a part of the source electrode or drain electrode 308). Here, the positional relationship between the drain electrode 308 and the first contact hole 310 is explained using FIG. 4. FIG. 4 is a diagram showing the structure of a part of the pixel 201 in the organic EL display device 100 of the first embodiment. Specifically, FIG. 4 shows an exploded view of the vicinity of the aperture part 204 in FIG. 2 seen from a planar view.

The first contact hole 310 is an aperture part for electrically connecting a pixel electrode 313 described herein and the source electrode or drain electrode 308. Therefore, as is shown in FIG. 4, the first contact hole 310 is arranged on the interior side of the external shape of the source electrode or drain electrode 308, and the source electrode or drain electrode 308 become exposed at the bottom surface of the first contact hole 310 at the point when the first contact hole 310 is formed.

Furthermore, a source electrode or drain electrode in the present embodiment correspond to [first conductor] in the scope of the patent claims. However, [first conductor] is not limited to a source electrode or drain electrode and may be any conductor electrically connected to a pixel electrode.

A second insulation layer 311 which functions as a protection layer is arranged above the first insulation layer 309. In the present embodiment, a thin film formed from an inorganic material is used as the second insulation layer 311. For example, it is possible to use an inorganic material such as silicon oxide, silicon nitride or silicon oxynitride. In particular, a silicon nitride film is useful as a protection layer since it has excellent gas barrier properties.

The second insulation layer 311 includes a second contact hole 312 which overlaps a part of the first contact hole 310 and a part of the surface of the first insulation layer 309. As is shown in FIG. 3 and FIG. 4, the second contact hole 312 overlaps a part of the first contact hole 310 and thereby exposes a part of the source electrode or drain electrode 308. In addition, since a part of the surface of the first insulation layer 309 is also overlapped, a part of the surface of the first insulation layer 309 is also exposed. As a result, the second contact hole 312 in the present embodiment is arranged astride from the interior of the first contact hole 310 above the surface of the first insulation layer 309.

The pixel electrode 313 overlaps a part of the second contact hole 312 and is arranged so as to be electrically connected with the source electrode or drain electrode 308. Since the pixel electrode 313 in the case of the present embodiment overlaps a part of the second contact hole 312, a part of the surface of the first insulation layer 309 remains exposed at a part which is not overlapped. The part of the first insulation layer 309 which is exposed (region 204 shown by the diagonal line in FIG. 4) corresponds to the aperture part 204 for removing water shown in FIG. 2.

In the organic EL display device 100 of the present embodiment, the pixel electrode 313 functions as an anode forming an organic EL element. The pixel electrode 313 is formed by either a top emission type structure or bottom emission type structure. For example, in the case of a top emission type structure, a metal film with a high reflectance is used as the pixel electrode 313 or a stacked structure of a high work function transparent conductive film such as an indium oxide transparent conductive film (ITO for example), or a zinc oxide transparent conductive film (IZO, ZnO for example) film and a metal film. Reversely, in the case of a bottom emission type structure, a transparent conductive film described above may be used as the pixel electrode 313. In the present embodiment, a top emission type organic EL display device is explained as an example.

A third insulation layer 314 formed from a resin material is arranged between adjacent pixel electrodes 313. The third insulation layer 314 includes an aperture part at a part which serves as a light emitting region of a pixel. That is, the third insulation layer 314 is arranged so as to cover the upper section of the thin film transistor 202 and an edge part of the pixel electrode 313. Since this type of third insulation layer 314 functions as a component which sections each pixel, it is also generally referred to as a [separation wall] or [bank]. The aperture part of the third insulation layer 314 is preferred to be formed so that the inner wall has a taper shape. When a light emitting layer described herein is formed in this way, it is possible to reduce coverage defects in an end part of the pixel electrode 313.

Furthermore, the third insulation layer 314 does not cover an end part of the pixel electrode 313 but may be made to function as a filler material which fills recessed parts caused by the first contact hole 310. It is possible to use a resin material such as polyimide, polyamide, acryl, epoxy or siloxane group as the third insulation layer 314.

Here, in the case where the structure of the present embodiment is adopted, the third insulation layer 314 contacts the first insulation layer 309 via the aperture part 204 for removing water described previously. Therefore, in a water extraction process (specifically, heating process) of the first insulation layer 309 after forming the third insulation layer 314 (that is, before forming a light emitting layer described herein), gas including water produced within the first insulation layer 309 escapes to the side of the third insulation layer 314 via the aperture part 204 and is emitted to the exterior passing through the interior of the third insulation layer 314. That is, water is not trapped within the third insulation layer 314 as in conventional technology and it is possible to perform a water removal process even after the second insulation layer 311 is arranged as a protection layer. In this way, it is possible to realize a display device with a high level of reliability.

An electroluminescence layer (EL layer) 315 is arranged above the pixel electrode 313 and third insulation layer 314. The EL layer 315 includes at least a light emitting layer formed from an organic material and functions as a light emitting part of an organic EL element. In addition to a light emitting layer, various types of charge transport layer such as an electron injection layer, electron transport layer, hole injection layer and hole transport layer may also be included in the EL layer 315.

Furthermore, in the present embodiment, a structure is adopted in which the EL layer 315 which emits white light is arranged and each color RGB is displayed by passing through a color filter. However, it is possible to use other structures and other materials in the EL layer 315 and the present invention is not particularly limited to the structure of the present embodiment. In addition, the EL layer 315 may also be formed only above pixel electrode 313. That is, the EL layer 315 is not formed above the third insulation layer 314 but may be coated for each pixel. For example, one pixel may be formed by three sub-pixels, an EL layer corresponding to each color R (red), G (green) and B (blue) may be formed in each of the three sub-pixels respectively, or one pixel may be formed by four sub-pixels, and an EL layer corresponding to each color R (red), G (green), B (blue) and white (W) may be formed in each of the four sub-pixels respectively.

A common electrode 316 which functions as a cathode of an organic EL element is arranged above the EL layer 315. Since the organic EL display device 100 in the present embodiment is a top emission type, a transparent electrode is used as the common electrode 316. A MgAg thin film or transparent conductive film (ITO or IZO) is used as a thin film for forming a transparent electrode. The common electrode 316 is arranged on the entire surface of the pixel part 102 abridging each pixel. In addition, the common electrode 316 is electrically connected to an exterior terminal via a conductive layer on a lower layer in a periphery region in the vicinity of the end part of the display part 102.

In the present embodiment, an EL element is formed by the pixel electrode 313, EL layer 315 and common electrode 316. Furthermore, a fourth insulation layer 317 formed from an inorganic material is arranged to protect the EL element from external water and the like. It is preferred that an inorganic insulation film with good compactness such as a silicon nitride film is used as the fourth insulation layer 317.

The first substrate 301 to the fourth insulation layer 317 explained above are collectively referred to as an array substrate in the present embodiment.

An opposing substrate is arranged via a filler material 318 which functions as an adhesive and a protection material above the array substrate. It is possible to use polyimide, polyamide, acryl, epoxy or siloxane group resin material as the filler material 318. A spacer may be arranged in the filler material 318 for securing a gap between the array substrate and opposing substrate. This type of spacer may be mixed into the filler material or can be formed using a resin above the array substrate. In addition, as long as it is possible to realize sufficient sealing at a substrate periphery part and maintain a gap between the array substrate and opposing substrate, it is also possible seal only the substrate periphery part with the interior being hollow without using the filler material 318. In addition, it is also possible to use a layer formed from polyimide, polyamide, acryl, epoxy or siloxane group resin material as it is as a sealing layer without using the opposing substrate.

Furthermore, in the present embodiment, [opposing substrate] includes a second substrate 319, a color filter 320 corresponding to each color RGB arranged on the main surface (surface facing the first substrate 301) of the second substrate 319 and black mask 321 arranged between the color filters. The black mask 321 can be formed using a metal material with a relatively lower reflectance than other metals such as titanium (Ti) or chrome (Cr), or a resin containing a black or equivalent pigment.

However, the structure of the opposing substrate is not limited to this. For example, an overcoat layer may be formed while planarizing after arranging the color filter 320 and black mask 321. In addition, the black mask 321 may be omitted and if the EL layer 316 is arranged separately for each pixel for each color RGBW, it is possible to omit the color filter from the opposing substrate. Furthermore, if the color filter is omitted or formed on the first substrate 301 side, it is also possible to omit the opposing substrate itself.

In the organic EL display device 100 of the present embodiment formed as described above, the second contact hole 312 arranged against the second insulation layer 311 functions both as an aperture part for electrically connecting a source electrode or drain electrode 308 with the pixel electrode 313 and as an aperture part for removing water. In this way, it is possible to electrically connect the drain electrode 308 with the pixel electrode 313 just by arranging the second contact hole 312, discharge gas including water from a planarized film and also improve the reliability of the organic EL display device.

Furthermore, although it is possible to separately arrange an aperture part for exposing the source electrode or drain electrode and an aperture part for removing water, in the case, since it is necessary to obtain a design margin for each aperture part, there is a danger that the area for securing the aperture parts becomes very large as a whole. In the case of the present embodiment, since it is possible to electrically connect a source electrode or drain electrode with a pixel electrode and form an aperture part for removing water using a single aperture part, there is the merit of having a compact structure compared to the case of arranging separate aperture parts.

Figure 5A:
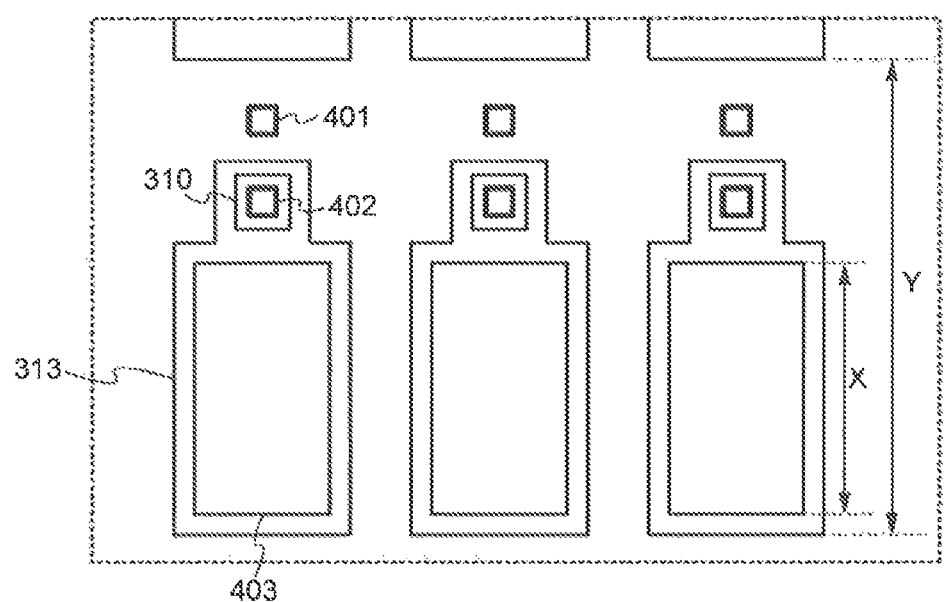
FIG. 5A is a diagram showing a structure of one part of a pixel of an organic EL display device as a comparative example.
Figure 5B:
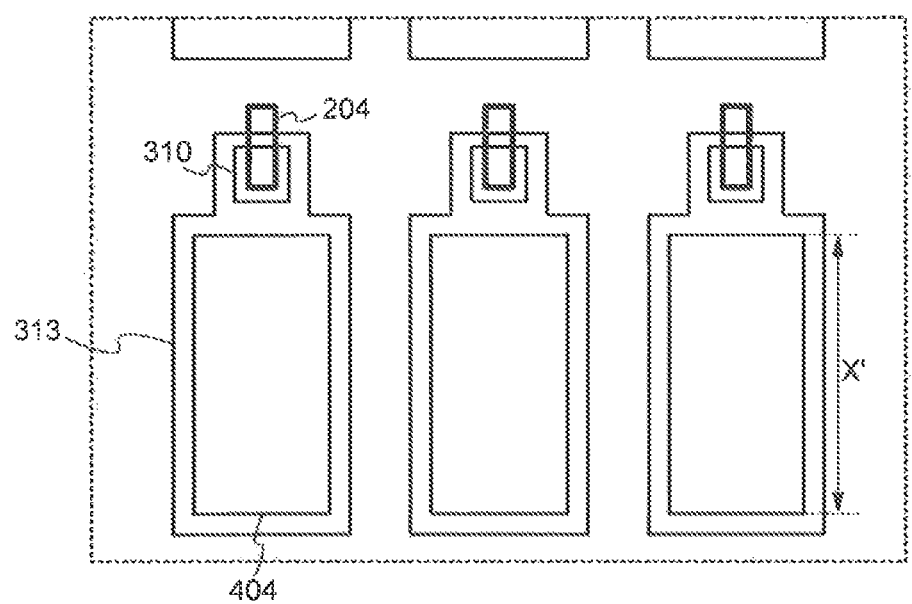
FIG. 5B is a diagram showing a structure of one part of a pixel of an organic EL display device of a first embodiment.
Figure 5C:
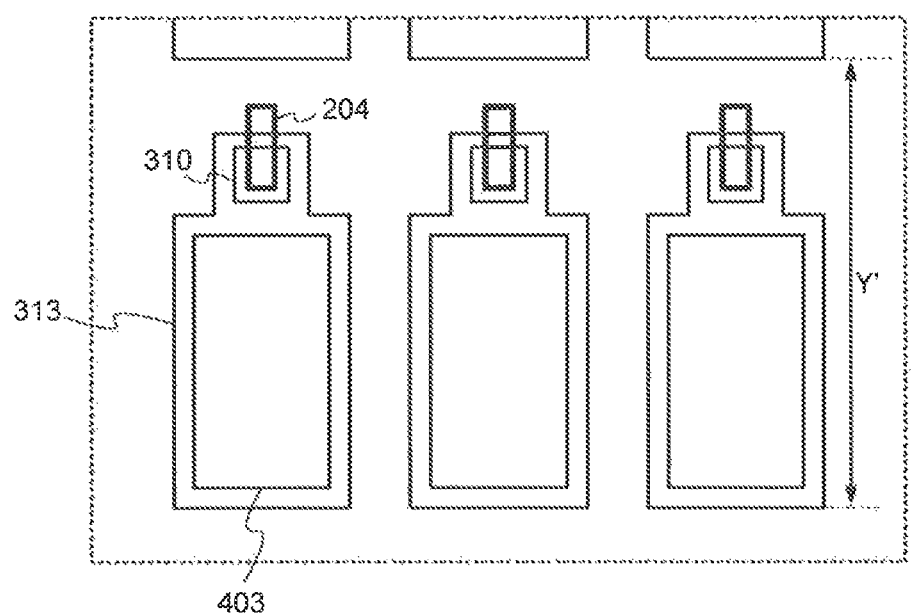
FIG. 5C is a diagram showing a structure of one part of a pixel of an organic EL display device as a comparative example.

For example, FIG. 5A is a diagram showing an example (comparative example) in the case where an aperture part 401 for exposing a source electrode or drain electrode and an aperture part 402 for removing water are separately arranged. However, FIG. 5B is a diagram showing an example (example 1) in the case where the aperture part 204 of the present embodiment is arranged and FIG. 5C is a diagram showing another example (example 2) in the case where the aperture part 204 of the present embodiment is arranged.

In the case of FIG. 5A, it is necessary to secure a design margin in both the aperture part 401 and aperture part 402 and integration at a high density is difficult. However, as is shown in FIG. 5B and FIG. 5C, the aperture part 204 according to the present embodiment can perform both electrical connection between a drain electrode and pixel electrode and remove water using a single aperture part. As a result, for example if the pixel size is the same, it is possible to make the width (X') of the light emitting region 404 in FIG. 5B larger than the width (X) of the light emitting region 403 in FIG. 5A. In this way, it is possible to increase the aperture ratio of a pixel and contribute to an improvement in luminosity of a display device. In addition, for example if the width of a light emitting region is the same, it is possible to make the pitch (Y') of a pixel in FIG. 5C narrower than the pitch (Y) of a pixel in FIG. 5A. In this way, it is possible to increase the pixel layout density and contribute to high definition of a display device.

The manufacturing process of the array substrate in the organic EL display device 100 of the present embodiment arranged with the structure described above is explained below while referring to FIG. 6A to FIG. 8.

<Manufacturing Method of a Display Device>

First, as is shown in FIGS. 6A and 6B, a ground layer 302 is formed above the first substrate 301 and the thin film transistor (TFT) 202 is formed thereupon. It is possible to use a glass substrate, silica substrate or flexible substrate (polyimide, polyethylene terephthalate, polyethylene naphthalate or a substrate which can be bent) as the first substrate 301. In the case where the first substrate 301 does not require light blocking properties, it is possible to use a metal substrate, ceramic substrate or semiconductor substrate.

Typically, it is possible to use an insulation layer formed from silicon oxide or silicon nitride or a stacked film of these as the ground layer 302. The ground layer 302 has a function for preventing the infiltration of contaminants from the first substrate 301 and relieving stress produced by stretching of the first substrate 301.

The thin film transistor 202 may also be formed using any method as described previously. For example, the semiconductor layer 303 is formed from silicon above the ground layer 302 and a gate insulation film 304 is formed from silicon oxide so as to cover the semiconductor layer 303. A gate electrode 305 is formed from a metal material above the gate insulation film 304 and an interlayer insulation film 306 is formed so as to cover the gate electrode 305. It is possible to use an insulation layer formed from silicon oxide or silicon nitride or a stacked film of these as the interlayer insulation film 306. Furthermore, a source electrode and drain electrode 307, 308 are formed from a metal material after forming a contact hole which contacts the semiconductor layer 303 in the interlayer insulation film 306 and gate insulation film 304.

The thin film transistor 202 is formed using the processes described above. Furthermore, although an example is exemplified in the present embodiment of forming a top gate type thin film transistor as the thin film transistor 202, a bottom gate type thin film transistor may also be used After the thin film transistor 202 is formed, the first insulation layer 309 is formed and the first contact hole 310 is formed contacting the source electrode or drain electrode 308 as is shown in FIG. 6B. In the present embodiment, a resin layer is formed from a photosensitive acryl resin as the first insulation layer 309 and the first contact hole 310 is formed by exposure using a photomask. Furthermore, the first insulation layer 309 is preferred to have a film thickness of 1~3 μm since it is used as a planarized film.

Next, as is shown in FIG. 7A, a second insulation layer 311 is formed so as to cover the first insulation layer 309 arranged with the first contact hole 310. Although a silicon nitride layer is used as the second insulation layer 311 in the present embodiment, a silicon oxide layer may also be used. The film thickness may be appropriately set within a range of 30~300 nm considering barrier properties with respect to water and the like. The second insulation layer 311 is patterned using a usual photolithography process and is arranged with a second contact hole 312. As is shown in FIG. 4, the second contact hole 312 is arranged bridging part of the first contact hole 310 and a part of the first insulation layer 309 in a rectangle shape.

When the second contact hole 312 is formed with respect to the second insulation layer 311, the pixel electrode 313 is formed as is shown in FIG. 7B. Furthermore, the pixel electrode 313 is formed corresponding to the position of each of a plurality of pixels respectively. Furthermore, the pixel electrode 313 is formed so as to cover the entire first contact hole 310 and a part of the second contact hole 312. Specifically, in the case of the present embodiment, a three layer structured conductive layer is formed sandwiching a silver thin film such as an ITO thin film and this conductive layer is patterned to form the pixel electrode 313. In the present embodiment, a silver thin film is used as a reflective layer in order to adopt a structure in which light is extracted towards the upper part (upwards is defined as the direction furthest from the first substrate 301) of the display device. The pixel electrode 313 formed in this way functions as an anode in an organic EL display element of the present embodiment.

Next, a third insulation layer 314 which functions as a bank is formed as is shown in FIG. 8. The third insulation layer 314 can be obtained by forming an aperture part in a part corresponding to the light emitting region of a pixel after forming a resin layer with film thickness of about 1 μm. That is, the third insulation layer 314 is formed so as to cover an upper part of the thin film transistor 202 and an edge part of the pixel electrode 313. As a result, a part of the third insulation layer 314 contacts the first insulation layer 309 via a part of the second contact hole 312.

In the present embodiment, when the third insulation layer 314 is formed, a heating process is performed in order to remove water from the first insulation layer 309 and third insulation layer 314. However, this process is not always required. Following this, an EL layer 315 is formed above the pixel electrode 313 and third insulation layer 314. In the present embodiment, a layer which emits white light is formed commonly for all pixels as the EL layer 315. In this way, it is possible to simplify the manufacturing process and construct a manufacturing process with a high productivity. Furthermore, in addition to a light emitting layer, a charge injection layer, charge transport layer or both may also be included in the EL layer 315. In addition, it is possible to form the EL layer 315 using a known method. For example, the EL layer 315 may be formed by forming a low molecular EL material using vapor deposition or by forming a high molecular EL material using an inkjet method or sputtering method and the like.

Next, a common electrode 313 which functions as a cathode of an organic EL element is formed. In the present embodiment, an ITO film or IZO film formed by a sputtering method are used as the common electrode 316. Other transparent conductive films may also be used and a metal film formed such as a MgAg film sufficiently thin to allow light to pass through may also be used. Following this, a fourth insulation layer 317 is formed from silicon nitride as a protection film. At this time, it is desirable that the common electrode 316 and fourth insulation layer 317 are formed consecutively so that they do not contact external air.

As described above, an array substrate of the organic EL display device of the present embodiment is complete. Furthermore, it is possible to obtain the organic EL display device 100 shown in FIG. 3 if the opposing substrate (substrate formed from the second substrate 319, color filter 320 and black mask 321) is bonded with the completed array substrate using the filler material 318.

Second Embodiment

Figure 10:
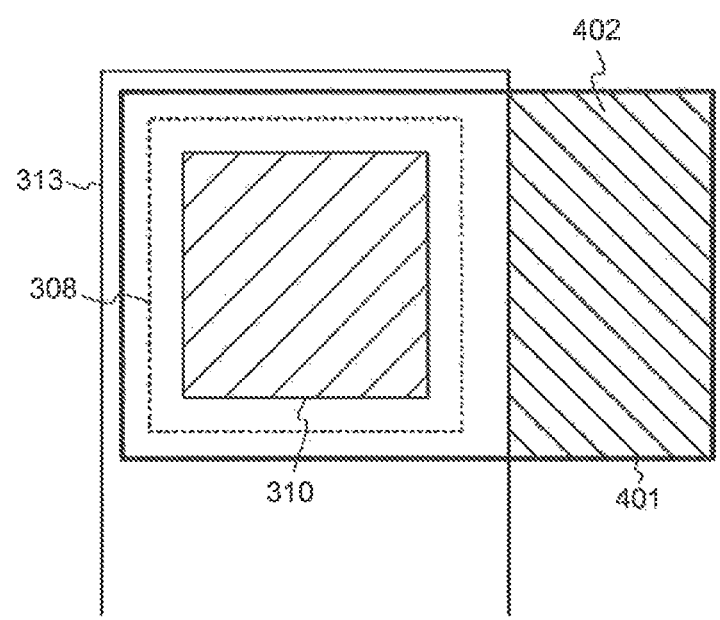
FIG. 10 is a diagram showing a structure of one part of a pixel of an organic EL display device of a second embodiment.

FIG. 9 is a diagram showing a structure of a pixel 201 of an organic EL display device 200 of the second embodiment. FIG. 10 is a diagram showing a structure of a part of the pixel 201 of the organic EL display device 200 of the second embodiment. The difference between the first and second embodiments is that in the organic EL display device of the second embodiment, a second contact hole 401 is arranged so as to overlap the entire range of the first contact hole 310. Since the remaining structure is the same as the organic EL display device 100 of the first embodiment, a detailed explanation is omitted.

In the structure shown in FIG. 3 in the first embodiment, an example is shown in which the second contact hole 312 arranged in the second insulation layer 311 overlaps a part of the first contact hole 310 arranged in the first insulation layer 309. In the case of the present embodiment, all of the second insulation layer 311 within the first contact hole 310 is removed as is shown in FIG. 9 and the second contact hole 401 overlaps the entire range of the first contact hole 310. That is, a region which serves as the second contact hole 401 encompasses a region which serves as the first contact hole 310.

In addition, the first contact hole 310 is arranged on the inner side of the second contact hole 312 from the planar view diagram shown in FIG. 10. As a result, a part of the source electrode or drain electrode 308 arranged underneath is exposed in the entire region of the bottom surface of the first contact hole 310.

As is clear from a comparison of FIG. 4 and FIG. 10, because the contact area between the source electrode or drain electrode 308 and the pixel electrode 313 increases in the case of the structure of the present embodiment, it is possible to obtain a good electrical connection between the two. Furthermore, the area of the aperture part 402 for removing water increases as the area of the second contact hole 312 increases, and the capability for discharging gas including water from the first insulation layer 309 is further improved.

As described above, the organic EL display device 200 of the present embodiment has a better electrical connection between the drain electrode 308 and pixel electrode 313 and better discharge capabilities of a gas including water from the first insulation layer 309 in addition to the effects explained with respect to the organic EL display device 100 of the first embodiment.

Third Embodiment

Figure 11:
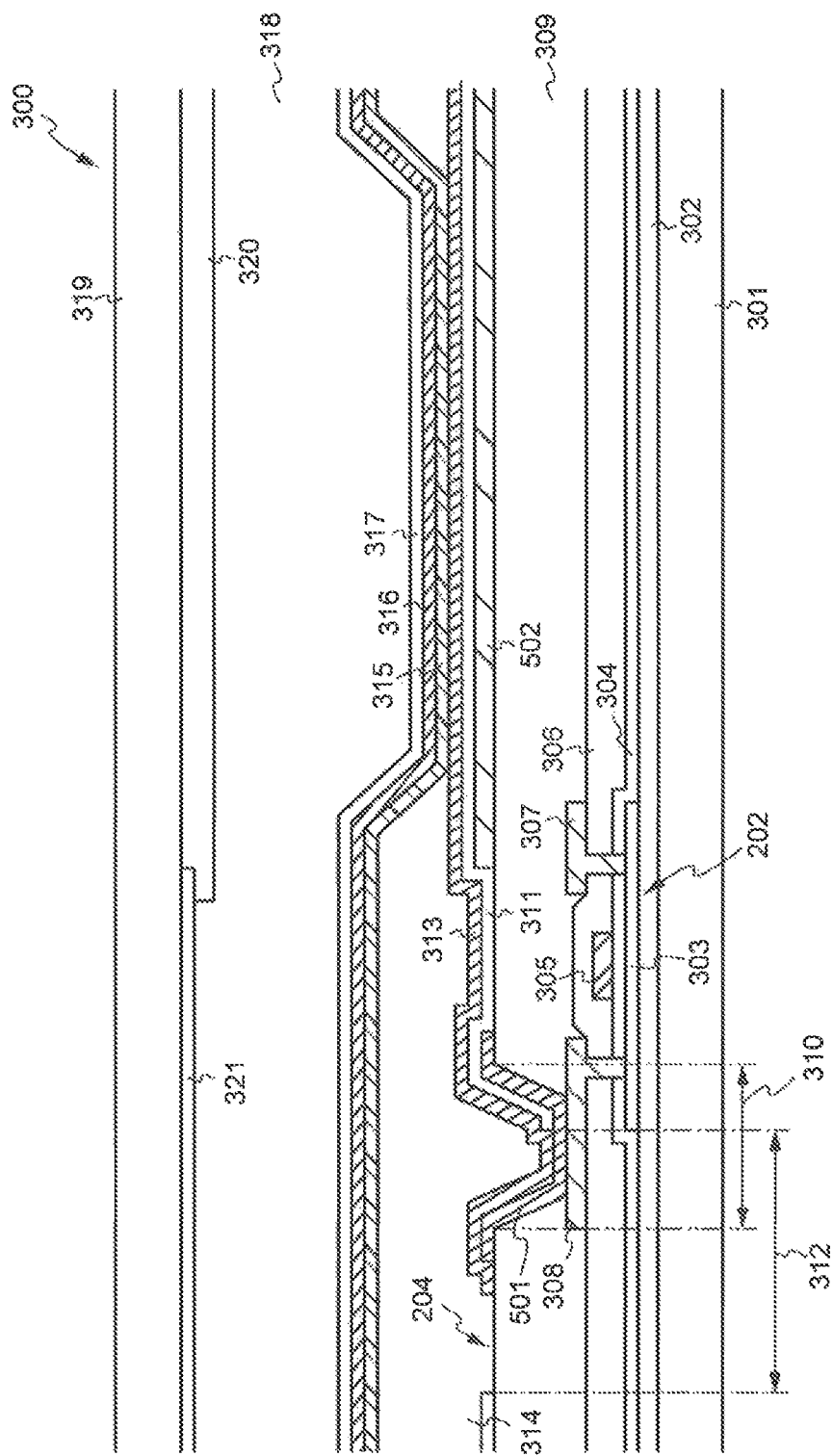
FIG. 11 is a diagram showing a structure of a pixel of an organic EL display device of a third embodiment.

FIG. 11 is a diagram showing a structure of a pixel 201 of an organic EL display device 300 of the third embodiment. FIGS. 12A, 12B, 13A and 13B are diagrams showing a manufacturing process of the organic EL display device 300 of the third embodiment. The difference between the first and third embodiments is that in the organic EL display device of the third embodiment, a second conductor is arranged so as to cover the first contact hole 310 and a capacitance electrode is arranged on the lower part of an organic EL element. Since the remaining structure is the same as the organic EL display device 100 of the first embodiment, a detailed explanation is omitted.

As is shown in FIG. 11, a second conductor 501 is arranged above the first contact hole 310 in the organic EL display device 300 of the present embodiment. The second conductor 501 functions as an electrode for electrically connecting the source electrode or drain electrode 308 with the pixel electrode 313. Although the second conductor 501 can be formed from various conductive materials, it is preferred to use a material which can secure a selection ratio at the time of etching between a conductive material for forming the capacitance electrode 502 described herein. In the present embodiment, it is possible to form the second conductor 501 using a transparent conductive material including at least one selected from ITO IZO and ZnO. In this way, the second conductor 501 can be made to function as an etching stopper when forming the capacitance electrode 502.

Furthermore, a third conductor 502 is arranged between the pixel electrode 313 and first insulation layer 309 in the organic EL display device 300 of the present embodiment. The third conductor 502 functions as a capacitance electrode in a pair with the pixel electrode 308. That is, since the second insulation layer 311 is arranged as a dielectric between the capacitance electrode 502 an pixel electrode 308, the third conductor 502 functions as one electrode of a capacitor connected to an EL element. Furthermore, the third conductor 502 may be electrically connected with a power supply wire or may be electrically connected with the common electrode 316.

The third conductor 502 can be formed from various conductive materials. Although the third conductor 502 is formed from a stacked structure sandwiching a molybdenum (Mo) thin film and aluminum (Al) thin film in the present embodiment, the third conductor 502 is not limited to this structure.

Next, a manufacturing process of the organic EL display device 300 of the third embodiment is explained. Furthermore, since the processes up to before forming the first contact hole 310 and the processes after forming the pixel electrode 313 are the same as in the first embodiment, an explanation is omitted here.

After forming the first contact hole 310 using the same process as in the first embodiment, in the present embodiment, a thin film is formed from ITO using a sputtering method as is shown in FIG. 12A, and the formed thin film is patterned to form the second conductor 501. At this time, the shape of the second conductor 501 is formed so as to overlap the entire range of the first contact hole 310 when viewing the organic EL display device 300 from above.

When the second conductor 501 is formed, the third conductor 502 is formed next as is shown in FIG. 12B. Specifically, a molybdenum thin film, aluminum thin film and molybdenum thin film are stacked in order and then patterned to form the third conductor 502 so as to cover the second conductor 501 and first insulation layer 309. At this time, since there is a sufficient selection ratio between the second conductor 501 and third conductor 502 with respect to an etchant used when etching the third conductor 502, the second conductor 501 is not etched or removed.

Furthermore, in the case where the second conductor 501 is not arranged, the source electrode or drain electrode 308 formed from a metal material including aluminum and the like exists below. Therefore, there is a danger that the source electrode or drain electrode 308 may also be etched when etching the third conductor 502. In the case of the structure of the present embodiment, since the second conductor 501 functions as an etchant stopper, etching is not performed as far as the source electrode or drain electrode 308 when forming the third electrode 502.

When the third conductor 502 is formed, the second insulation layer 311 including the second contact hole 312 is formed as is shown in FIG. 13A. The second contact hole 312 is formed to overlap abridge a part of the first contact hole 310 and a part of the first insulation layer 309 the same as in the first embodiment. However, unlike the first embodiment, the source electrode or drain electrode 308 is not exposed even if the second contact hole 312 is formed and instead the second conductor 501 is exposed.

After the second insulation layer 311 is formed, the pixel electrode 313 is formed next as is shown in FIG. 13B. The pixel electrode 313 can be formed from a transparent conductive material including at least one selected from ITO, IZO and ZnO. In the present embodiment, the pixel electrode 313 is also formed so as to cover the entire first contact hole 310 and a part of the second contact hole 312. Furthermore, although the pixel electrode 313 is formed so as to cover an end part of the second conductor 501 as is shown in FIG. 13B, the pixel electrode 313 may also be formed so as to expose an end part.

As described above, according to the present embodiment, by arranging the third conductor 502 which functions as a capacitance electrode on a lower part of the pixel electrode 313, it is possible to effectively utilize almost the entire region of a pixel as a capacitor. In addition, by arranging the second conductor 501 which functions as an etchant stopper on an upper part of the first contact hole 310 when forming such as capacitor, it is possible to form the third conductor 502 without etching the source electrode or drain electrode 308.

Each embodiment of the present invention described above can be carried out by an appropriate combination as long as they do not mutually contradict each other. In addition, a person ordinarily skilled in the art could appropriately add, remove or change the design of structural elements or add, omit or change the conditions of processes based on the EL display device of each embodiment, as long as the gist of the present invention is provided, these are included in the scope of the present invention.

In addition, other operational effects different to the operational effects brought about by each embodiment described above, those that are obvious from the descriptions in the present specification or those that could be easily predicted by a person ordinarily skilled in the art should also be interpreted as being brought about by the present invention.

What is claimed is:

1. A semiconductor device comprising:
   a first electrode;
   a first insulation layer including a first exposing region exposing an underlying layer beneath the first insulation layer;
   a second insulation layer including a second exposing region exposing an underlying layer beneath the second insulation layer;
   a second electrode covering a part of the second exposing region, and being electrically connected to the first electrode via the part of the second exposing region; and
   a third insulation layer covering the second exposing region, and being in contact with the first insulation layer via another part of the second exposing region, wherein
   a part of an edge of the second exposing region is in the first exposing region in a planar view, and
   a part of an edge of the first exposing region is in the second exposing region in a planar view.

2. The semiconductor device according to claim 1, wherein
   the part of the second exposing region overlaps with the part of the first exposing region in a planar view.

3. The semiconductor device according to claim 1, wherein
   the third insulation layer covers an edge of the second electrode, and exposes a part of an upper surface of the second electrode.

4. A light emitting device having the semiconductor device according to claim 3, further comprising:
   a light emitting layer covering the part of the upper surface of the second electrode; and
   a common electrode covering the light emitting layer.

5. The semiconductor device according to claim 1, wherein
   the first insulation layer and the third insulation layer comprise an organic insulating material, and
   the second insulation layer comprises an inorganic insulating material.

6. The semiconductor device according to claim 1, further comprises a third electrode, wherein
   the third electrode covers the first exposing region, and
   the second electrode is electrically connected to the first electrode via the third electrode.

7. The semiconductor device according to claim 6, wherein
   the third electrode entirely covers the first exposing region in a planar view.

8. A transistor array substrate comprising:
   a transistor having a gate, a source and a drain;
   a first electrode being electrically connected to one of the source and the drain of the transistor;
   a first insulation layer including a first exposing region exposing an underlying layer beneath the first insulation layer;
   a second insulation layer including a second exposing region exposing an underlying layer beneath the second insulation layer;
   a second electrode covering a part of the second exposing region, and being electrically connected to the first electrode via the part of the second exposing region; and
   a third insulation layer covering the second exposing region, and being in contact with the first insulation layer via another part of the second exposing region, wherein
   a part of an edge of the second exposing region is in the first exposing region in a planar view, and
   a part of an edge of the first exposing region is in the second exposing region in a planar view.

9. The transistor array substrate according to claim 8, wherein
   the part of the second exposing region overlaps with the part of the first exposing region in a planar view.

10. The transistor array substrate according to claim 8, wherein
    the third insulation layer covers an edge of the second electrode, and exposes a part of an upper surface of the second electrode.

11. The transistor array substrate according to claim 8, wherein
    the first insulation layer and the third insulation layer comprise an organic insulating material, and
    the second insulation layer comprises an inorganic insulating material.

12. The transistor array substrate according to claim 8, further comprises a third electrode, wherein
the third electrode covers the first exposing region, and
the second electrode is electrically connected to the first electrode via the third electrode.

13. The transistor array substrate according to claim 12, wherein
the third electrode entirely covers the first exposing region in a planar view.

* * * * *